US 6,707,404 B1

(12) United States Patent
Yilmaz (10) Patent No.: US 6,707,404 B1
(45) Date of Patent: Mar. 16, 2004

(54) INTEGRAL NONLINEARITY ERROR CORRECTION CIRCUITRY AND METHOD FOR DAC

(75) Inventor: Abdullah Yilmaz, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/419,450

(22) Filed: Apr. 21, 2003

(51) Int. Cl.[7] ............................................... H03M 1/10
(52) U.S. Cl. ..................... 341/120; 341/144; 341/145
(58) Field of Search ................................. 341/145, 144, 341/136, 153, 154, 120

(56) References Cited

U.S. PATENT DOCUMENTS

| | | | | |
|---|---|---|---|---|
| 5,396,245 A | * | 3/1995 | Rempfer | 341/145 |
| 5,703,586 A | * | 12/1997 | Tucholski | 341/144 |
| 5,801,655 A | * | 9/1998 | Imamura | 341/145 |
| 5,859,606 A | * | 1/1999 | Schrader et al. | 341/144 |
| 6,246,351 B1 | | 6/2001 | Yilmaz | 341/145 |
| 6,448,917 B1 | * | 9/2002 | Leung et al. | 341/144 |
| 6,496,133 B1 | | 12/2002 | Yilmaz | 341/154 |

* cited by examiner

Primary Examiner—Brian Young
Assistant Examiner—John Nguyen
(74) Attorney, Agent, or Firm—W. Daniel Swayze, Jr.; W. James Brady; Frederick J. Telecky, Jr.

(57) ABSTRACT

An M+N bit DAC includes an N-bit interpolation circuit for interpolating between a first voltage (Vhigh) on a first conductor (17A) and a second voltage (Vlow) on a second conductor (17B), an output amplifier (10), a calibration interpolation circuit (14), a memory circuit (36) for storing error information corresponding to various values of the first voltage and second voltage, outputs of the N-bit interpolation circuit and the calibration interpolation circuit being coupled to inputs of the output amplifier, and switching circuitry responsive to a N-bit portion of a M+N input word coupling the memory to inputs of the of the calibration interpolation circuit so as to correct integral nonlinearity errors associated with the various values of the first and second voltages.

23 Claims, 5 Drawing Sheets

INTEGRAL NONLINEARITY ERROR CORRECTION CIRCUITRY AND METHOD FOR DAC

BACKGROUND OF THE INVENTION

The present invention relates generally to string digital-to-analog converters (string DACs) and associated interpolation circuits thereof, and more particularly to circuitry and techniques for calibrating interpolating string DACs to correct integral nonlinearity (INL) errors.

The assignee's U.S. Pat. No. 6,246,351 issued Jun. 12, 2001 entitled "LSB Interpolation Circuits and Method for Segmented Digital-to-Analog Converter", incorporated herein by reference, and U.S. Pat. No. 6,496,133 issued Dec. 17, 2002 entitled "Resistor String Integrated Circuit and Method for Reduced Linearity Error", both by the present inventor, are generally indicative of the state of the art for interpolating string DACs.

Monotonicity and low INL are usually required in applications in which DACs, including string DACs, are used. The INL error is the difference between the actual output of a DAC and the "ideal" output of the DAC. Resistor mismatches in string DACs cause INL error. String DACs are commonly fabricated using submicron CMOS technologies wherein it is expensive to utilize precision resistors to ensure monotonicity of the DAC, because manufacture of the precision resistors requires expensive laser trimming operations. The matching of the resistors used in the "string" section of a string DAC limits the INL of a string DAC. With careful layout of the string resistors, 10-bit accuracy of the matching of the resistances of the string resistors is possible in the present state-of-to-art CMOS fabrication processes. Therefore, the INL of a 16-bit interpolating string DAC will be at the 64 LSB level. This means the output of the DAC may be as much as 64 LSBs different than what an ideal DAC would produce, which is unacceptably large for some applications.

Next, the structure and operation of a basic conventional interpolating string DAC will be described. Referring to prior art FIG. 1, a 4-bit interpolating string DAC 1 includes a 2-bit coarse string DAC 2, the output of which is interpolated by 2-bit interpolator DAC 6. The coarse string DAC 2 includes a resistor string 25 including four equal-resistance series-connected resistors R1, R2, R3, and R4 and tap points 4-1,2,3, and 4 therebetween. The voltages on nodes 4-1,2,3,4 of the resistor string are assumed to be 48, 56, 108, and 128 "voltage units". Each of the voltage units referred to is equal to the reference voltage divided by the number of string resistors. Typically, the reference voltage is 1.5 volts, 2.5 volts, or 5 volts. Coarse string DAC 2 produces two output levels Vhigh and Vlow which are the voltage of the upper terminal and lower terminal, respectively, of a selected one of the series-connected resistors R1–R4 that constitute the resistor string of coarse string DAC 2. The resistor referred to is selected in response to the MSB code b3b2 of the digital input provided to string DAC 1.

Figure 1:
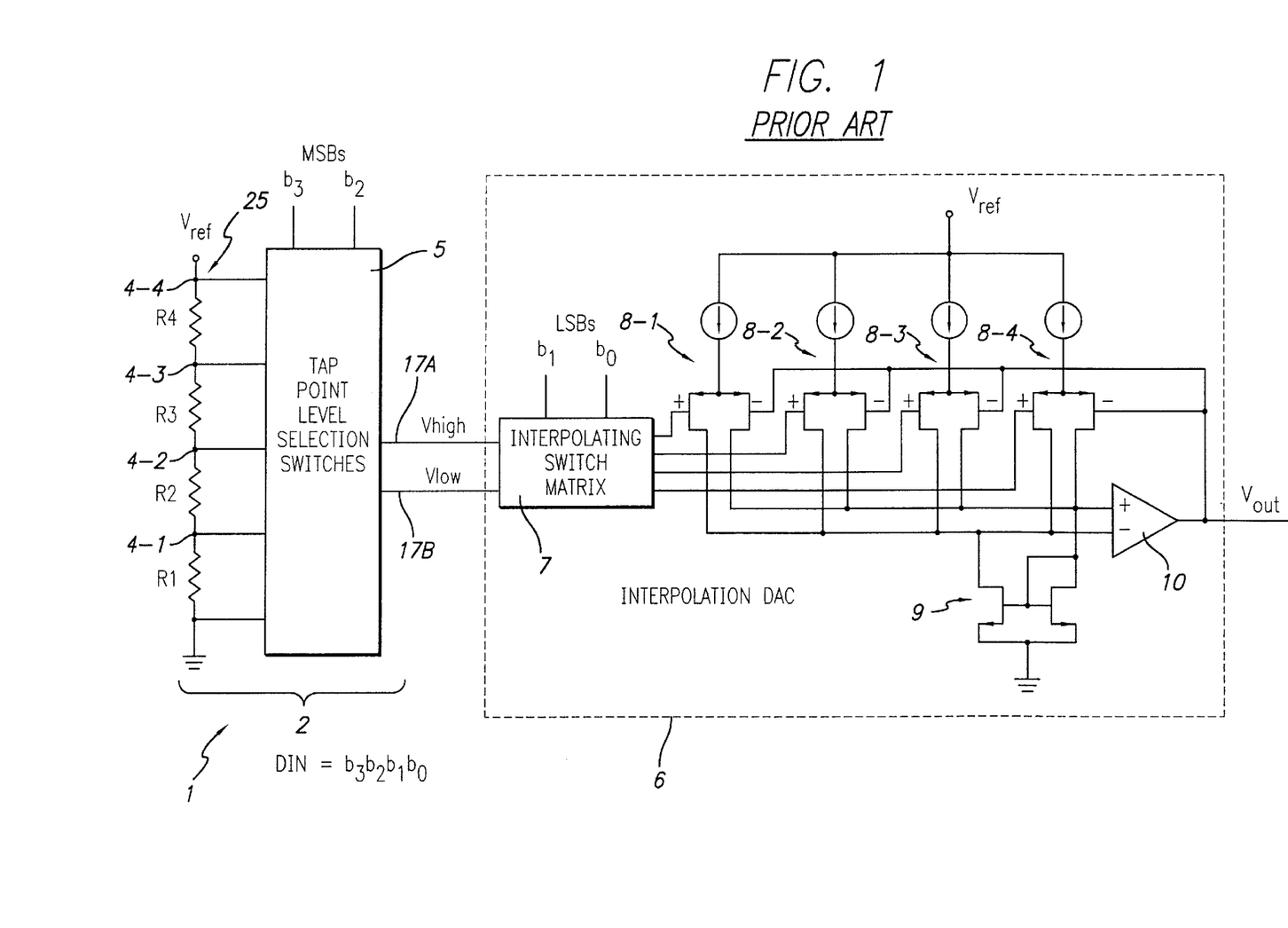
FIG. 1 is a schematic diagram of prior art interpolating string DAC.

The output of coarse string DAC 2 is applied to the input of an interpolation DAC 6, which interpolates to produce a voltage level that is proportionately between Vhigh and Vlow in response to the LSBs b1b0 of the digital input word applied to string DAC 1. The structure and operation of string DAC 1 are set forth in detail in above-mentioned U.S. Pat. No. 6,246,351 issued Jun. 12, 2001 entitled "LSB Interpolation Circuits and Method for Segmented Digital-to-Analog Converter", which is incorporated herein by reference.

The example of prior art FIG. 1 shows a 2-bit interpolator, but the basic approach can be applied to an n-bit interpolator. Level selection switches 5 operate to connect the input of the interpolator 6 to two consecutive voltages, Vhigh and Vlow. The number of gm stages 8-1,2,3,4 having an input connected to Vhigh is equal to the decimal value of the LSB digital input b1b0 that is applied to interpolating switch matrix 7. In other words, the interpolating switch matrix 7 functions as a thermometer decoder. If b1 and b0 both are equal to zero, all of the (+) inputs of interpolator DAC 6 are connected to Vlow, and the output Vout will then be equal to Vlow. If the digital input to the switching matrix 7 is 01, then the (+) input of one of the gm stages 8-1,2, 3,4 is connected to Vhigh. Since one of 4 of the (+) inputs is connected to Vhigh, that gm stage adds an offset as indicated in the following equation:

$$Vout = Vlow + (Vhigh - Vlow)/4 (b_1 b_0 = 01)$$

When the LSB digital input b1b0 is 10, two of the four (+) inputs of the gm inputs are connected to Vhigh. This causes interpolation DAC 6 to add yet another offset voltage to the output as indicated in the following equation:

$$Vout = Vlow + 2*(Vhigh - Vlow)/4 (b_1 b_0 = 10)$$

When the LSB digital input b1b0 is 11, three of the four (+) inputs of the gm stage are connected to Vhigh. This causes interpolation DAC 6 to add yet another offset voltage to the output as indicated in the following equation:

$$Vout = Vlow + 3*(Vhigh - Vlow)/4 (b_1 b_0 = 11)$$

In general, for an N-bit interpolator, when k of the positive inputs (or thermometer-decoded LSBs) are connected to Vhigh, Vout will be given by the following equation:

$$Vout = Vlow + k*(Vhigh - Vlow)/2^N.$$

The foregoing equation indicates that linear interpolation is achieved between Vhigh and Vlow.

Thus, there is an unmet need for a circuit and method for reducing the INL of an interpolating string DAC, especially for an interpolating string DAC having a resolution of 16 bits or greater.

There also is an unmet need for a circuit and method for reducing the INL of an interpolating string DAC having a resolution of 16 bits or greater without use of precision resistors or laser trimming of resistors.

There also is an unmet need for an inexpensive interpolating string DAC, especially one having a resolution of 16 bits or greater, having very low integral nonlinearity.

There also is an unmet need for an inexpensive interpolating string DAC, especially one that has a resolution of 16 bits or greater and is compatible with present CMOS technologies.

SUMMARY OF THE INVENTION

Therefore, it is an object of the present invention to provide an inexpensive interpolating string DAC having very low integral nonlinearity, especially one having a resolution of 16 bits or greater.

It is another object of the present invention to provide a circuit and method for reducing the INL of an interpolating string DAC, especially for an interpolating string DAC having a resolution of 16 bits or greater.

It is another object of the present invention to provide a circuit and method for reducing the INL of an interpolating string DAC having a resolution of 16 bits or greater without use of precision resistors or laser trimming of resistors.

It is another object of the invention to provide an inexpensive interpolating string DAC that is suitable for manufacturing using a low-cost CMOS process.

Briefly described, and in accordance with one embodiment, the present invention provides an M+N bit DAC includes an N-bit interpolation circuit for interpolating between a first voltage (Vhigh) on a first conductor (17A) and a second voltage (Vlow) on a second conductor (17B), an output amplifier (10), a calibration interpolation circuit (14), a memory circuit (36) for storing error information corresponding to various values of the first voltage and second voltage, outputs of the N-bit interpolation circuit and the calibration interpolation circuit being coupled to inputs of the output amplifier, and switching circuitry responsive to a N-bit portion of a M+N input word coupling the memory to inputs of the of the calibration interpolation circuit so as to correct integral nonlinearity errors associated with the various values of the first and second voltages.

In the described embodiment, the invention provides an interpolation circuit for interpolating between a first voltage (Vhigh) on a first conductor (17A) and a second voltage (Vlow) on a second conductor (17B), including a plurality of differential voltage-to-current converter circuits (8-1,2,3,4) each including a first transistor and a second transistor each having a source coupled to a corresponding current source, an output amplifier (10) having first and second inputs coupled to drains of various first and second transistors, respectively, the output amplifier producing an output voltage coupled to a gate of each of the second transistors, a first switch circuit (7) adapted to selectively couple gates of various first transistors to one configured of the first conductor (17A) and the second conductor (17B) in response to a plurality of digital bit signals (b1b0), respectively, and a calibration interpolation circuit (14) including a plurality of differential voltage-to-current converter circuits (13-1,2,3,4) each including a first transistor and a second transistor each having a source coupled to a corresponding current source, a memory circuit (36) coupled to a third conductor (Vhclb) and a fourth conductor (Vlclb) for storing error information corresponding to various values of the first voltage (Vhigh) and second voltage (Vlow) and accessible to provide stored error correction information on the third (Vhclb) and fourth (Vlclb) conductors, a second switch circuit (21) adapted to selectively couple gates of various first transistors of the plurality of differential voltage-to-current converter circuits (13-1,2,3,4) of the calibration interpolation circuit to one configured of the third conductor (Vhclb) and the fourth conductor (Vlclb) in response to the plurality of digital bit signals (b1b0), respectively, and a drain of each of the first transistors of the calibration interpolation circuit (14) being coupled to the first input of the output amplifier and a drain of each of the second transistors of the calibration interpolation circuit being coupled to the second input of the output amplifier so as to cause the output amplifier to produce a value of the output voltage that is corrected for the errors in the various values of the first (Vhigh) and second (Vlow) voltages.

In the described embodiment, the invention provides an M+N bit digital-to-analog converter (DAC) for converting an M+N bit input word including an M-bit MSB subword and an N-bit LSB subword to an analog output signal, including a string DAC section (2), and interpolation DAC section (6), and a calibration interpolation circuit (14). The string DAC section (2) includes a plurality of series-connected string resistors (R1–4), and an MSB subword decoding and switching circuit (5) adapted to selectively couple voltages on first and second terminals of a selected string resistor to first (17A) and second (17B) conductors in response to the MSB subword, respectively, first and second terminals of the various string resistors being coupled to various tap points of the plurality of series-connected string resistors. The interpolation DAC section (6) includes a plurality of differential converter circuits or gm circuits (8-1,2,3,4) each including a current source and a first transistor and a second transistor each having a source coupled to the current source, a first LSB subword decoding and switching circuit (7) adapted to selectively couple gates of various first transistors of the interpolation DAC section (6) to one configured of the first (17A) and second (17B) conductors in response to the LSB subword, respectively, and an output amplifier (10) having first (−) and second (+) inputs coupled to drains of various first transistors and second transistors of the interpolation DAC section (6) and to a load circuit (9A,B) and producing an output voltage coupled to a gate of each of the second transistors. The calibration interpolation circuit (14) includes a plurality of differential voltage-to-current converter circuits or gm circuits (13-1,2,3,4) each including a current source and a first transistor and a second transistor each having a source coupled to the current source, a memory (36) coupled to third (38A) and fourth (38B) conductors for storing tap point error information for the various tap points and accessible in response to the MSB subword to provide stored tap point error information on the third (38A) and fourth (38B) conductors, and a second LSB subword decoding and switching circuit (21) adapted to selectively couple gates of various first transistors of the plurality of differential converter circuits (13-1,2,3,4) of the calibration interpolation circuit to one of the third conductor (38A) and the fourth conductor (38B) in response to the MSB subword.

In the described embodiment, a drain of each of the first transistors of the calibration interpolation circuit (14) is coupled to the first input (−) of the output amplifier and a drain of each of the second transistors of the calibration interpolation circuit being coupled to the second input (+) of the output amplifier so as to cause the output amplifier to produce a value of the output voltage that is corrected for the integral nonlinearity of the M+N bit digital-to-analog converter. A voltage calibration generator circuit performs the function of generating error voltages corresponding to the various tap points and measuring error information for each tap point equal to the difference between an actual tap point voltage and an ideal tap point voltage for that tap point and storing the measured error information in the memory circuit. The memory is accessed at memory addresses determined in response to the M-bit MSB subword both to initially write the tap point error information into the memory and later to provide stored tap point error information to the third (38A) and fourth (38B) and conductors during normal operation of the M+N bit digital-to-analog converter.

BRIEF DESCRIPTION OF THE DRAWINGS

FIG. 2 is a schematic diagram of an interpolating string DAC including a calibration interpolator according to the present invention.

DETAILED DESCRIPTION OF THE PREFERRED EMBODIMENTS

Referring to FIG. 2, calibrated interpolating string DAC 20 includes all of the components of prior art interpolating string DAC 1 of FIG. 1, and further includes a calibration interpolator circuit 14 which operates to reduce the INL error of the above described prior all interpolating string DAC 1. For simplicity, the resistor string 25 of coarse DAC 2 is illustrated to include only four string resistors R1,2,3, and 4 of substantially equal resistances R connected in series between Vref and ground. Specifically, resistor R1 is connected between ground and a tap point 4-1. Resistor R2 is connected between tap point 4-1 and a tap point 4-2. Resistor R3 is connected between tap point 4-2 and a tap point 4-3,and resistor R4 is connected between tap point 4-3 and a tap point 4-4, which is also connected to Vref. The tap point level selection switch and decoder circuit 5, details of which can be the same as shown the above incorporated-by-reference U.S. Pat. No. 6,246,351, has five inputs connected to ground and tap points 4-1,2,3, and 4, respectively. Tap point level selection switches and decoder 5 operate in response to the MSB portion of the digital input word DIN to select the lower voltage and upper voltage of one of the string resistors to produce the output voltages Vhigh and Vlow.

Interpolating switch matrix and decoder 7 of main interpolator 6 in FIG. 2 operates in response to the LSB portion of DIN, i.e., to b1b0, to apply Vlow to the (+) input of one of the 4 gm stages 8-1,2,3,and 4 and to apply Vhigh to the (+) input of one, two, or three of the remaining gm stages so as to interpolate between Vlow and Vhigh according to the values of b1 and b0 and produce a corresponding current signal in conductor 11. Interpolating switch matrix and decoder 7 in FIG. 2 is essentially the same as the corresponding switch circuitry shown in above mentioned U.S. Pat. No. 6,246,351. A similar 16-bit version might for example, include a 10-bit MSB subword and 1024 series-connected string resistors and a 6-bit LSB subword.

Each of gm stages 8-1,2,3 and 4 of main interpolator 6 includes a tail current source coupled between Vref and the sources of a pair of P-channel input transistors. The (+) input of each gm stage is connected to the gate of one of the transistors and to a corresponding output of interpolating switch matrix and decoder 7, and the (−) input of each gm stage is connected to Vout. Vout is produced by the output of an amplifier 10 which has its (+) input connected by conductor 11 to the drain of the (−) transistor of each of the four gm stages and to the gate and drain of an N-channel transistor 9B of a current mirror load circuit 9 and also to the gate of an N-channel transistor 9A of current mirror 9. The (−) input of amplifier 10 is connected by conductor 12 to the drain of the (+) transistor of each of gm stages 8-1,2,3,4 and to the drain of transistor 9A. The sources of transistors 9A and 9B are connected to ground.

Both interpolating switch matrix and decoder circuit 7 and calibration interpolating switch matrix and decoder circuit 21 can be constructed using identical unit interpolator cells. However, one could be constructed of unit interpolator cells and the other could be constructed of binary weighted cells. Each of the unit interpolator cells includes a tail current source and two essentially identical differentially connected transistors.

In calibration interpolator 14, each of gm stages 13-1,2,3 and 4 includes a tail current source coupled between Vref and the sources of a pair of P-channel input transistors. The (+) input of each gm stage is connected to the gate of one of the input transistors thereof and also to a corresponding output of calibration interpolating switch matrix and decoder 21, and the (−) input of each gm stage is connected to the gate of one of the input transistors thereof and also to another corresponding output of calibration interpolating switch matrix and decoder 21, which is very similar to interpolating switch and matrix decoder 7 except that the former has 8 outputs. Calibration interpolating switch matrix and decoder circuit 21 performs the function of connecting the gate electrodes of the various (+) and (−) transistors of the gm stages 13-1,2,3 and 4 to either Vhclb or Vlclb, depending on the LSBs of DIN so as to perform the function of interpolating between calibration voltages (also referred to as error voltages) Vhclb and Vlclb which ideally would appear on the ones of the above mentioned tap points selected in response to the LSB portion b1b0 of DIN. The drain of the (+) input transistor of each of gm stages 13-1,2,3 and 4 is connected to above mentioned conductor 15. The drain of the (−) input transistor of each of gm stages 13-1,2,3 and 4 is connected to above mentioned conductor 12.

An error coefficient generation circuit 30 generates and stores the calibration coefficients in calibration coefficient memory 36 and presents the corresponding analog values Vhclb and Vlclb on conductors 38A and 38B, respectively, for all of the possible MSB codes and selectively provides them as needed to calibration interpolation switch matrix and decoder 21 in response to the MSBs during normal operation of calibrated interpolating string DAC 20. Error coefficient generation circuit 30 includes a calibration voltage generator 26,27 that produces correction voltages corresponding to the upper terminal and lower terminal of each string resistor on corresponding pairs of the plurality of conductors 32, respectively, in response to the MSBs of DIN. Conductors 32 are connected to inputs of a calibration decoder circuit 35, which performs the functions of selecting correction voltages from circuitry, such as circuit 26 shown in FIG. 5 or circuit 27 shown in FIG. 6, located within calibration voltage generator 26,27, and writing the tap point calibration coefficient voltages into a nonvolatile calibration coefficient memory 36 when they are initially determined, as subsequently explained. Calibration coefficient decoder 35 also accesses calibration coefficient memory 36 to retrieve stored calibration coefficients as they are needed in response to the MSBs in order to calibrate Vout during normal operation of DAC 20 so as to correct for its INL errors. Calibration decoder circuit 35 is coupled by buses 37A and 37B to calibration coefficient memory 36 to allow writing tap point calibration coefficients into calibration coefficient memory 36 and to allow retrieving of stored calibration coefficients therefrom.

Memory 36 stores calibration coefficients for the various tap points 4-1,2,3, and 4. Calibration decoder 35 selects the appropriate calibration voltage from a set of predefined calibration voltages (Vhclb and Vlclb), which are generated in the manner subsequently described. (However, in some cases, it may be acceptable to calibrate only selected tap points, rather than all of them as described above.)

The calibration coefficients can be generated as follows. During the calibration error coefficient measurement, Vhclb and Vlclb are connected to same voltage so the input to calibration interpolator 14 is equal to zero. This disables the calibration section of string DAC 20, and string DAC 20 then temporarily operates as an uncalibrated string DAC. By setting the LSBs to zero and only changing the MSBs, string DAC 20 only produces string tap voltages of resistor string 25, and these voltages are measured at the DAC output Vout, and then are converted from analog values to digital values, and then are compared with the ideal expected values, which are the MSB values of DIN. The differences between the various digitized actual tap point voltages measured at Vout and the corresponding expected ideal values of the MSBs are the "tap point error voltages", which then are written into calibration coefficient memory 36.

The tap point voltage errors can be formulated as follows:

$$INLR(n) = V\text{measured} - n2^N LSB(\text{ideal})$$

where $n = 1, 2, \ldots, 2^N - 1$ are the tap point numbers.

$$LSB(\text{ideal}) = FS/2^{(M+N)},$$

where M and N are the resolution of the resistor string 25 and main interpolator 6, respectively, and FS is the full scale value of calibrated interpolating DAC 20. For the example shown in FIG. 2, M=2, N=2, and FS=128 are chosen so LSB(ideal) is equal to 8.

Figure 3:
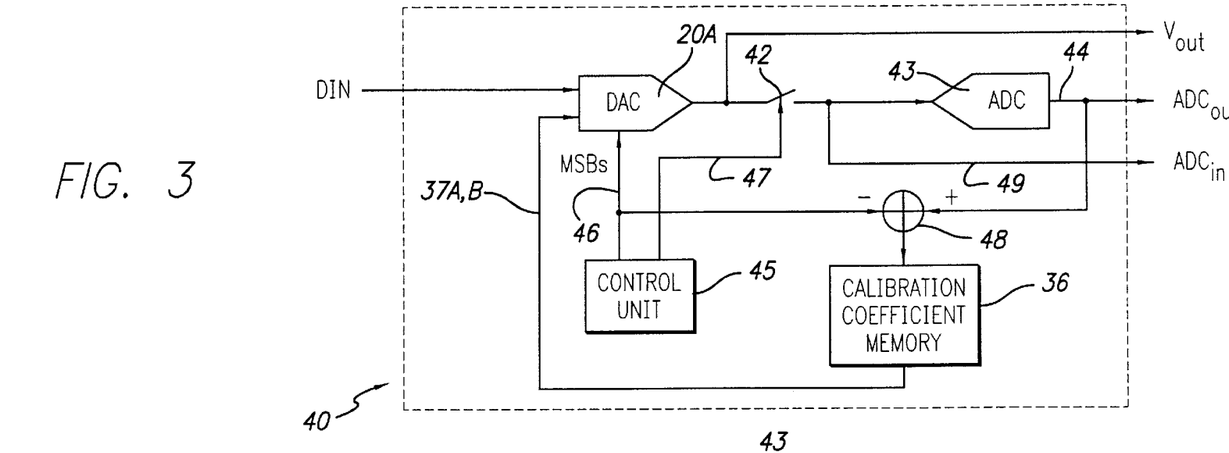
FIG. 3 is a block diagram of a single integrated circuit chip including all of the calibrated interpolating string DAC 20 of FIG. 2, including the error coefficient generation circuit 30 including an ADC and a subtracter.
Figure 4:
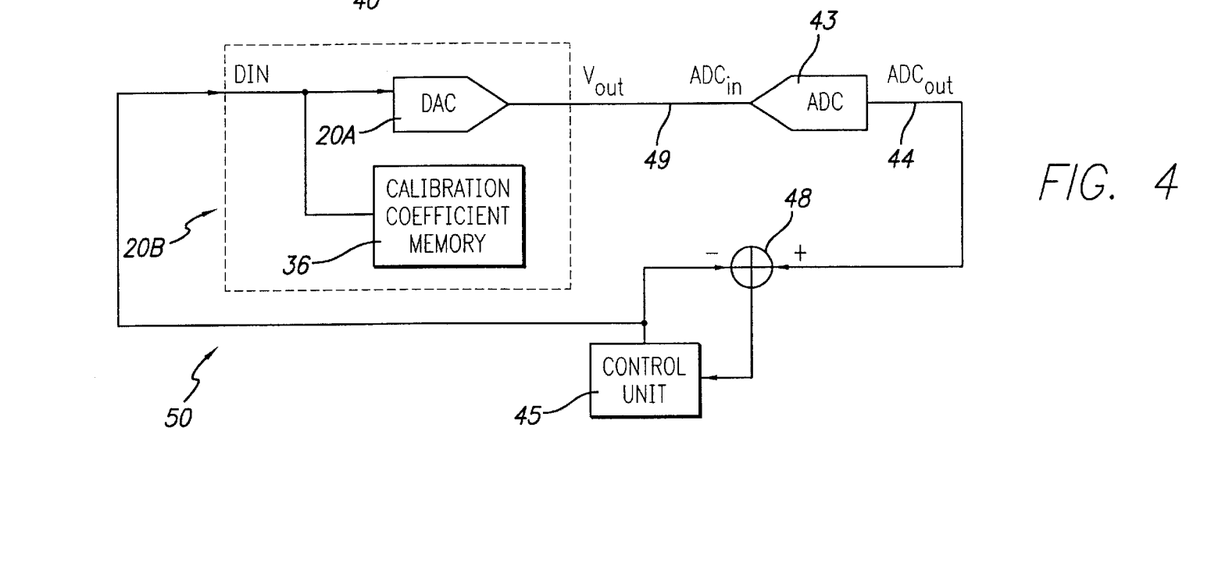
FIG. 4 is a block diagram of a system including a single chip that includes a calibrated interpolating string DAC as shown in FIG. 2 without the calibration decoder circuit 35 and the calibration voltage generator 26,27, and including an off-chip ADC, an off-chip subtracter, and an off-chip control unit.

The measurements of the tap point voltages can be performed either by an on-chip circuit as shown in FIG. 3 or an off-chip circuit as shown in FIG. 4. If calibrated interpolating DAC 20 is part of system included on an integrated circuit chip 40 as shown in FIG. 3 including an analog-to-digital converter 43 and a microcontroller or control unit 45 that is easily accessible, they can be utilized to effectuate measurement and storage of the calibration coefficients.

Referring to FIG. 3, a single integrated circuit chip 40 includes DAC 20A, which is essentially the same as calibrated interpolation DAC 20 of FIG. 2 without the coefficient memory. Chip 40 also includes an analog-to-digital converter (ADC) 43, a microcontroller or control unit 45, a nonvolatile calibration coefficient memory 36, and a digital subtracter 48. The digital input DIN is applied to some of the digital inputs of DAC 20A. Additional MSB inputs produced by microcontroller 45 are applied via bus 46 to additional digital inputs of DAC 20A and also to the (−) inputs of digital subtracter 48. The output Vout of DAC 20A is coupled by a switch 42 to the input of ADC 43 which is closed during the initial determination of the calibration coefficients and the storing of a them in calibration memory 36. Switch 42 is open thereafter, in order to allow normal operation of the calibrated interpolating string DAC including DAC 20A and calibration coefficient memory 36.

During determination and storing of the calibration coefficients, the input of ADC 43 is connected to the Vout with DAC 20A operating as an uncalibrated string DAC, as previously explained. The digital output of ADC 43 is ADCout, which is applied via bus 44 to the (+) inputs of digital subtracter 48. The output of digital subtracter 48 provides the various calibration coefficients, which are transmitted to the data input of calibration coefficient memory 36 to be stored therein. The data output of calibration coefficient memory 36 is connected to DAC 20A in order to input the presently needed stored calibration coefficients to the input conductors 37A and 37B of calibration interpolator 14. Microcontroller 45 produces a control signal on conductor 47 that operates switch 42. In this approach, control unit 45 initiates the calibration sequences and sends all of the possible MSB combinations of the DAC digital input code DIN to DAC 20A and, and at the same time connects its output Vout to the input of the on-chip ADC 43 by closing switch 42. For each MSB code applied along bus 46 to DAC 20A, ADC 43 produces one value of the ADCout code. As can be seen from FIG. 3, the differences between these codes are computed by subtracter 48 and then are stored in calibration coefficient memory 36 so they can be used later in the string tap point error calibration.

During manufacture of system 40, the previously described measurements of the calibration coefficient tap point error voltages are made using chip 40 of FIG. 3 to generate the calibration coefficients, which then are written into calibration coefficient memory 36.

Figure 5:
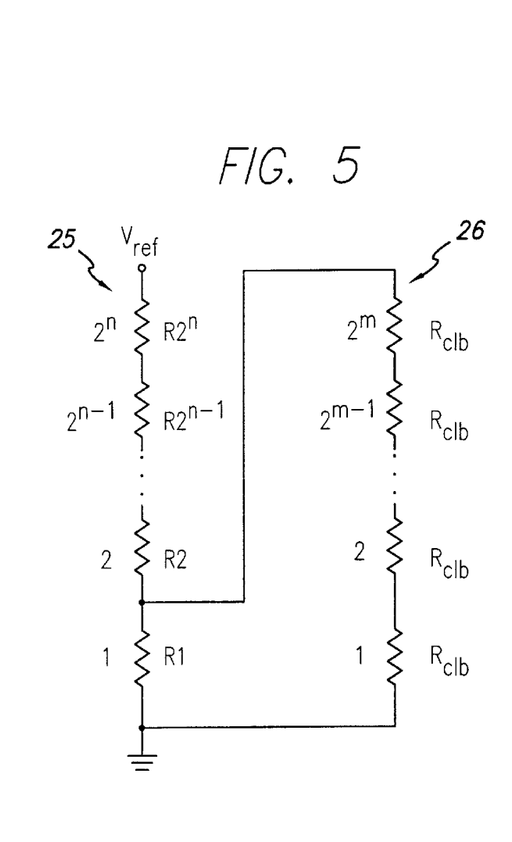
FIG. 5 is a schematic diagram of a secondary resistor string connected in parallel with a main resistor string for generating calibration voltage values of integral nonlinearity error.
Figure 6:
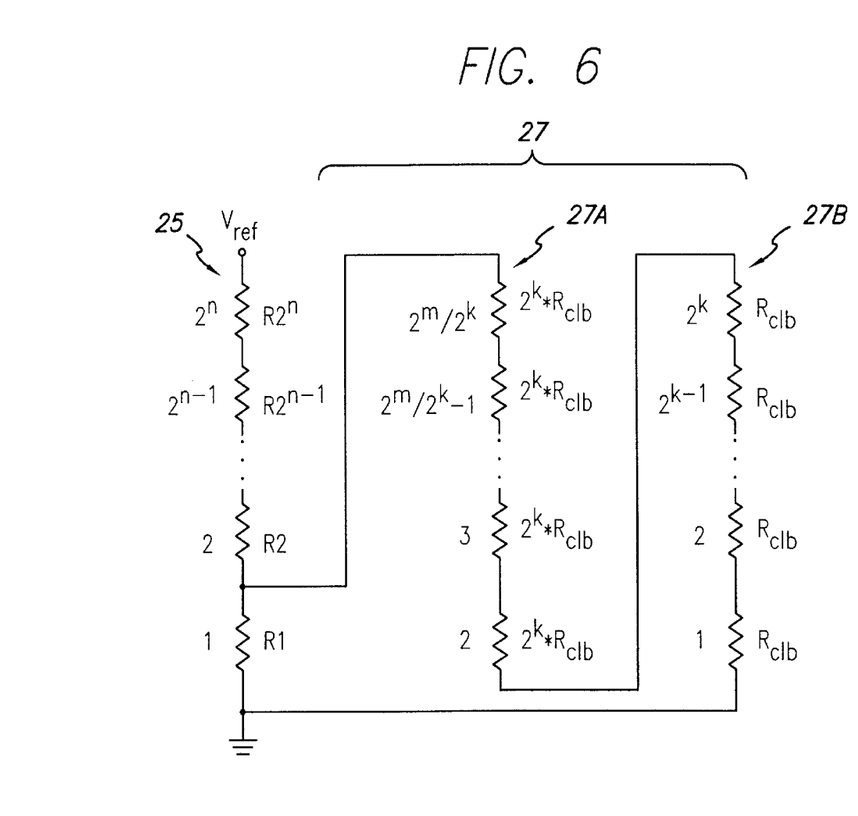
FIG. 6 is a schematic diagram of another secondary resistor string connected in parallel with a main resistor string for generating calibration voltage values of integral nonlinearity error.

Calibration voltage generator 26,27 can include either the calibration string 26 of FIG. 5 or the calibration string 27 of FIG. 6, and calibration decoder circuit 35 responds to the MSB code b3b2 in order to access a corresponding pair of digital calibration coefficients, one to calibrate a value of Vhigh on conductor 17A and the other to calibrate a value of Vlow on conductor 17B, from memory 36 and decode the two calibration coefficients to select a corresponding value of Vhclb and a corresponding value of Vlclb from the appropriate nodes of calibration string 26 (FIG. 5) or 27 (FIG. 6) of calibration voltage generator 26,27 and then produce those voltages Vhclb and Vlclb on conductors 38A and 38B, respectively, thereby performing a digital-to-analog conversion of the pair of digital calibration coefficients.

If an on-chip ADC 43 and an on-chip microcontroller 45 are not available, then they may be provided "off-chip", as shown in FIG. 4. The structure of the system 50 shown in FIG. 4 is essentially the same as the structure included in the single integrated circuit chip 40 in FIG. 3, except that DAC 20A and calibration coefficient memory 36 are included as part of a single chip 20B that constitutes calibrated interpolating string DAC 20 of FIG. 2.

For the "prior art" portion of the calibrated, interpolating string DAC 20 shown in FIG. 2, if the all DIN codes are "exercised" in the prior art portion (i.e., the portion shown in prior art FIG. 1), and if it is assumed that main interpolator 6 is an ideal interpolator (i.e., the interpolator has no error), then the values shown in Table 1 can be obtained. The reference voltage Vref is assumed to be the sum of 128 voltage units, and the voltage drop, referred to herein as "delV", as shown in Table 1. In Table 1, non-ideal values of Vlow and Vhigh are assumed for simplicity. In Table 1, the quantity delV is the voltage across the particular string resistor selected by the MSB portion b3b2 of DIN, starting from the lower string resistor R1 to the top string resistor R4. The quantity INLR is equal to the actual string tap voltage for the tap point selected by the MSB portion b3b2 of DIN minus the ideal voltage INL for that tap point, and therefore is given by the equation:

$$INLR = V\text{high}(\text{actual}) - V\text{high}(\text{ideal}).$$

INL is given by the equation:

$$INL = V\text{out} - V\text{out\_ideal}.$$

The INL Table 1 shows the various INL errors that appear in the coarse string DAC 2 for the above example of the "prior art" portion of the calibrated, interpolating string DAC 20 of FIG. 2. The INLR values of the resistor string shown in Table1 are first measured, and then stored in calibration coefficient memory 36.

It can be seen from Table 1 that error on the tap points appears as an INL error at the output Vout.

TABLE 1

| DIN | Vlow | Vhigh | delV | INLR | Vout-ideal | Vout | INL |
|-----|------|-------|------|------|------------|------|-----|
| 0000 | 0 | 48 | 48 | 16 | 0 | 0 | 0 |
| 0001 | 0 | 48 | 48 | 16 | 8 | 12 | 4 |
| 0010 | 0 | 48 | 48 | 16 | 16 | 24 | 8 |
| 0011 | 0 | 48 | 48 | 16 | 24 | 36 | 12 |
| 0100 | 48 | 56 | 8 | −8 | 32 | 48 | 16 |
| 0101 | 48 | 56 | 8 | −8 | 40 | 50 | 10 |
| 0110 | 48 | 56 | 8 | −8 | 48 | 52 | 4 |
| 0111 | 48 | 56 | 8 | −8 | 56 | 54 | −2 |
| 1000 | 56 | 108 | 52 | 12 | 64 | 56 | −8 |
| 1001 | 56 | 108 | 52 | 12 | 72 | 69 | −3 |
| 1010 | 56 | 108 | 52 | 12 | 80 | 82 | 2 |
| 1011 | 56 | 108 | 52 | 12 | 88 | 95 | 7 |
| 1100 | 108 | 128 | 20 | −12 | 96 | 108 | 14 |
| 1101 | 108 | 128 | 20 | −12 | 104 | 113 | 9 |
| 1110 | 108 | 128 | 20 | −12 | 112 | 118 | 6 |
| 1111 | 108 | 128 | 20 | −12 | 120 | 123 | 3 |

In accordance with the present invention, if nonvolatile memory can be fabricated using a particular CMOS fabrication process used to fabricate a string DAC, then the INL of the string DAC can be calibrated.

The calibration of INL error for a 16-bit interpolating string DAC including and 8-bit coarse string DAC the output of which is interpolated by and 8-bit interpolator can be accomplished using the basic circuitry and method described herein. Measurements performed by the assignee on prior art interpolating string DACs show that 64-LSB INL with at least 90 percent wafer yields. The assignee's measurements indicate that the interpolator section has better than 8-bit matching, which suggests that the INL error is caused by the resistor string rather than the interpolator therefore, and 8-bit coarse string DAC followed by and 8-bit interpolator can be provided wherein the INL of the resistor string is calibrated so as to provide low-level INL from the calibrated interpolating string DAC. In one embodiment, the string tap errors are measured and stored in a nonvolatile memory. Correction voltages are added to or subtracted from the un-calibrated DAC output to provide calibrated output voltage with very low net INL error.

Referring to FIG. 2, the same LSB bits are used as inputs to interpolating switch matrix and decoder 7 of the main interpolator 6 and calibration interpolating switch matrix and decoder 21 of calibration interpolator 14, in order to ensure that the calibrated, interpolating string DAC 20 is monotonic. The inputs provided to main interpolator 6 constitute selected actual voltages of the tap points 4-1,2,3 and 4, whereas the inputs provided to calibration interpolator 14 constitute selected values of INLR, i.e., Vhcld–Vlclbb, which correspond to tap point error voltages for the various MSB codes of DIN If the gm stages 8-1,2,3 and 4 and the gm stages 13-1,2,3 and 4 all have the same values of tail current and if there input transistors all have the same W/L ratios (i.e., a channel-width-to-channel-length ratios), any interpolation produced by calibration interpolator 14 results in a differential calibration current that is summed with or subtracted from the differential interpolation current produced by main interpolator 6 and therefore results in the calibrated value of Vout being produced by calibrated interpolating string DAC 20. The differential calibration current is proportional to the above mentioned INLR of the coarse string DAC 2 for the present value of DIN.

The output voltage Vout of calibrated interpolating string DAC 20 is given by the following equation:

$$\text{Vout} = V_{dacm} + V_{dclb} \quad \text{(Equation 1)}$$

where $V_{dacm}$ is the component of Vout due to main interpolator 6 and $V_{dclb}$ is the component of Vout due to calibration interpolation switch matrix and decoder 21.

As previously indicated, the component of Vout due to the "prior art" portion of calibrated interpolating string DAC 20 (i.e., the part that is identical to FIG. 1 ) is given by the following equation:

$$V_{dacm} = V\text{low} + k*(V\text{high} - V\text{low})/2^N \quad \text{(Equation 2)}$$

where N is the resolution of main interpolator 6, which in this case is equal to 2.

It can be shown that the component of Vout due to the calibration portion of calibrated interpolating string DAC 20 is given by the following equation:

$$V_{dclb} = -(\text{sign}\{INLR(n+1)\}*k*abs(INLR(n+1))+\text{sign}\{INLR(n)\}*(2^N-k)*abs(INLR(n)))/2^N \quad \text{(Equation 3)},$$

where $N=1,2,\ldots,2^{M-1}$, and where k is the decimal input value of LSB portion b1b0 of the input digital code applied to main interpolator 6 and calibration interpolator 14. If b1b0=00, then k=0 and all the (+) inputs and (−) inputs of gm stages 8-1,2,3 and 4 are connected to Vlow by interpolating switch matrix and decoder 7. If b1b0=11, then k=3 so 3 out of the 4 gm stages 8-1,2,3 and 4 are connected to Vhigh. The first tap points error and the last point tap error are zero (i.e. INLR(0)=INLR($2^M$)=0, where M is the resolution of the resistor string. Note that the lowest tap point is at ground and therefore cannot have a voltage error, and the highest tap point is that the reference voltage and therefore also cannot have a voltage error. Sign $\{X\}$ means the algebraic sign of the argument X. INLR(n) indicates the error voltage of the tap points and n is the value of the MSB portion b3b2 of DIN (which is also equal to the tap point number) from which Vlow is connected to the input of main interpolator 6. Vlow is selected in response to the MSB portion b3b2 of DIN. That is, n is the decimal equivalent value of the b3b2.

The term inp(i) is used herein to denote the (+) input of the $i^{th}$ stage of main interpolator 6. The terms inpp(i) and innn(i) are used to denote the (+) and (−) input of the $i^{th}$ stage of the calibration interpolation switch matrix and decoder 21. If sign $\{INLR(n)\}$ is positive, then inpp(i) is connected to receive the value INLR(n) and innn(i) is connected to analog ground. When the sign$\{INLR(n)\}$ is negative, then instead of connecting the inpp(i) input to a negative voltage and connecting the innn(i) input to analog ground, the functions of the inputs are swapped so that the inpp(i) input is connected to analog ground and the innn(i) is connected to receive the value abs(INLR(n)). Both approaches produce the same value of Vout without generating a negative voltage.

Calibrated interpolating string DAC 20 of FIG. 2 operates by, in effect, measuring the voltages of all of the tap points 4-1,2,3 and 4 of the resistor string and then determining the value of INLR for all of the tap points. The result of this is shown in Table 2, where INLR is the actual value of the tap point voltage under consideration minus the ideal value of voltage of that tap point. These values are written into coefficient calibration memory 36 so they can be used later during the calibration process.

TABLE 2

| tap points | Actual | Ideal | INLR |
|---|---|---|---|
| 0 | 0 | 0 | 0 |
| 1 | 48 | 32 | 16 |
| 2 | 56 | 64 | −8 |
| 3 | 108 | 96 | 12 |
| 4 | 128 | 128 | 0 |

The INLR values can be generated by the above described circuitry including subtracter 48. The following definitions are useful in explaining how the inputs of the various gm stages are connected by interpolating switch matrix and decoder 7 to the tap point voltage levels Vhigh and Vlow selected by tap point level selection switches 5:

The term inp(i)=Vhigh/Vlow means that the (+) input of the $i^{th}$ gm stage of main interpolator 6 is connected to Vhigh or Vlow;

The term inpp(i)=INLR(n) means that the (+) input of the $i^{th}$ gm stage of calibration interpolation switch matrix and decoder 21 is connected to receive the INLR(n) value; and The term innn (i)=INLR(n) means that the (−) input of the $i^{th}$ gm stage of calibration interpolation switch matrix and decoder 21 is connected to receive the INLR(n) value.

With the above information in mind, the calibration technique of the present invention can be explained for the calibrated interpolating string DAC 20 of FIG. 2.

b3b2b1b0=0000

From Table 1, it can be seen that Vlow=0, Vhigh=48, INLR(n=0)=0, INLR(n+1 =1)=16, sign{INLR(0)}=1, and sign{INLR(1)}=1. k is equal to 0, so inp(0–3)=Vlow=0 for main interpolator 6. Substituting this information into Equation (2) results in:

$V_{dacm}$=Vlow+$k$*(Vhigh−Vlow)/$2^2$=0+0*(48−0)/$2^2$=0.

For calibration and interpolation switch matrix and decoder 21, inpp(0–3) are coupled to receive INLR(0)=0, and innn (0–3) are coupled to analog ground. Substituting information from Table 1 into Equation (3) results in:

$V_{dclb} = -(sign\{INLR(1)\} * k * \text{abs}(INLR(1)) +$ $sign\{INLR(0)\} * (2^2 - k) * \text{abs}(INLR(0)))/2^2$ $= -(1*0*16 + 1*(2^2 - 0)*0)/2^2$ $= -(0 + 0)$ $= 0.$ Therefore, according to Equation (1), the DAC output Vout is:

Vout=$V_{dacm}$+$V_{dclb}$=0−0=0.

b3b2b1b0=0001

From Table 1, it can be seen that Vlow=0, Vhigh=48, INLR(0)=0, INLR(1)=16, sign{INLR(0)}=1, and sign{INLR(1)}=1. k is equal to 1, so inp(0)=Vhigh=48 and inp(1–3)=Vlow=0 for main interpolator 6. Substituting this information into Equation (2) results in:

$V_{dacm}$=Vlow+$k$*(Vhigh−Vlow)/$2^2$=0+1*(48−0)/$2^2$=12.

For calibration and interpolation switch matrix and decoder 21, inpp(1) is coupled to receive INLR(1)=16, and inpp(1–3) are coupled to receive INLR(0)=0, and innn(0–3) are coupled to analog ground. Substituting information from Table 1 into Equation (3) results in:

$V_{dclb} = -(sign\{INLR(1)\} * k * \text{abs}(INLR(1)) +$ $sign\{INLR(0)\} * (2^2 - k) * \text{abs}(INLR(0)))/2^2$ $= -(1*1*16 + 1*(2^2 - 1)*0)/2^2$ $= -(16 + 0)/4$ $= -4.$ Therefore, according to Equation (1), the DAC output Vout is:

Vout=$V_{dacm}$+$V_{dclb}$=12+(−4)=8.

b3b2b1b0=0010

From Table 1, it can be seen that Vlow=0, Vhigh=48, INLR(0)=0, INLR(1)=16, sign{INLR(0)}=1, and sign{INLR(1)}=1. k is equal to 2, so inp(0,1)=Vhigh=48 and inp(2,3)=Vlow=0 for main interpolator 6. Substituting this information into Equation (2) results in:

$V_{dacm}$=Vlow+$k$*(Vhigh−Vlow)/$2^2$=0+2*(48−0)/$2^{2}$=24.

For calibration and interpolation switch matrix and decoder 21, inpp(1,2) is coupled to receive INLR(1)=16, inpp(2,3) are coupled to receive INLR(0)=0, and innn(0–3) are coupled to 0 (i.e., analog ground).

$V_{dclb} = -(sign\{INLR(1)\} * k * \text{abs}(INLR(1)) +$ $sign\{INLR(0)\} * (2^2 - k) * \text{abs}(INLR(0)))/2^2$ $= -(1*2*16 + 1*(2^2 - 2)*0)/2^2$ $= -(32 + 0)/4$ $= -8.$ Therefore, according to Equation (1), the DAC output Vout is:

Vout=$V_{dacm}$+$V_{dclb}$=24+(−8)=16.

b3b2b1b0=0011

From Table 1, it can be seen that Vlow=0, Vhigh=48, INLR(0)=0, INLR(1)=16, sign{INLR(0)}=1, and sign{INLR(1)}=1. k is equal to 3, so inp(0–2) are coupled to receive Vhigh=48, and inp(3) are coupled to receive Vlow=0 for main interpolator 6. Substituting this information into Equation (2) results in:

$V_{dacm}$=Vlow+$k$*(Vhigh−Vlow)/$2^2$=0+3*(48−0)/$2^2$=36.

For calibration and interpolation switch matrix and decoder 21, inpp(0–2)=INLR(1)=16 and inpp(3)=INLR(0)=0 innn (0–3)=0

$$V_{dclb} = -(sign\{INLR(1)\} * k * \text{abs}(INLR(1)) +$$
$$sign\{INLR(0)\} * (2^2 - k) * \text{abs}(INLR(0)))/2^2$$
$$= -(1 * 3 * 16 + 1 * (2^2 - 3) * 0)/2^2$$
$$= -(48 + 0)/4$$
$$= -12,$$

Therefore, according to Equation (1), the DAC output Vout is:

$$\text{Vout} = V_{dacm} + V_{dclb} = 36 + (-12) = 24.$$

Next, the MSB portion b3b2 of DIN changes from 00 to 01, which operates to select the next resistor R2, so Vlow=48, Vhigh=56, INLR(n=1)=16, INLR(n+1=2)=−8, so sign{INLR(1)}=1 and sign{INLR(2)}=−1.

b3b2b1b0=0100 n=1, and k=0. From Table 1, it can be seen that Vlow=48, Vhigh=56, INLR(n=1)=16, INLR(n+1=2)=−8, sign{INLR(1)}=1, and sign{INLR(2)}=−8. For main interpolator 6, inp(0–3) are equal to Vlow=46. Substituting this information into Equation (2) results in:

$$V_{dacm} = \text{Vlow} + k*(\text{Vhigh} - \text{Vlow})/2^2 = 48 + 0*(56-48)/2^2 = 48.$$

For calibration and interpolation switch matrix and decoder 21, inpp(0–3) are coupled to receive INLR(1)=16, and innn(0–3) are coupled to analog ground. Substituting information from Table 1 into Equation (3) results in:

$$V_{dclb} = -(sign\{INLR(2)\} * k * \text{abs}(INLR(2)) +$$
$$sign\{INLR(1)\} * (2^2 - k) * \text{abs}(INLR(1)))/2^2$$
$$= -(-1 * 0 * 8 + 1 * (2^2 - 0) * 16)/2^2$$
$$= -(0 + 4 * 16)/4$$
$$= -16.$$

Therefore, according to Equation (1), the DAC output Vout is:

$$\text{Vout} = V_{dacm} + V_{dclb} = 48 + (-16) = 32.$$

b3b2b1b0=0101 n=1, and k=1. From Table 1, it can be seen that Vlow=48, Vhigh=56, INLR(n=1)=16, INLR(n+1=2)=−8, sign{INLR(1)}=1, and sign{INLR(2)}=−1. For main interpolator 6, inp(0)=Vhigh=56, and inp(1–3) are equal to Vlow=48. Substituting this information into Equation (2) results in:

$$V_{dacm} = \text{Vlow} + k*(\text{Vhigh} - \text{Vlow})/2^2 = 48 + 1*(56-48)/2^2 = 48 + 8/4 = 50.$$

For calibration interpolation switch matrix and decoder 21, since the tap error voltage is negative, it is necessary to swap the inputs of calibration and interpolation switch matrix and decoder 21, so inpp(0)=0, innn(0)=8, inpp(1–3) are equal to INLR(1)=16, innn(1–3) are equal to 0. Even though the tap INLR(2) is −8, the negative sign is obtained by swapping the functions of the input of gm stage 13-1. Instead of connecting inpp(0)=−8 and innn(0)=0, inpp(0) can be set to 0 and innn(0) can be set to 8. They both produce same value of Vout. Substituting this information into Equation (2) results in:

$$V_{dclb} = -(sign\{INLR(2)\} * k * \text{abs}(INLR(2)) +$$
$$sign\{INLR(1)\} * (2^2 - k) * \text{abs}(INLR(1)))/2^2$$
$$= -(-1 * 1 * 8 + 1 * (2^2 - 1) * 16)/2^2$$
$$= -10.$$

Therefore, according to Equation (1), the DAC output Vout is:

$$\text{Vout} = V_{dacm} + V_{dclb} = 50 + (-10) = 40.$$

b3b2b1 b0=0110 n=1, and k=2. From Table 1, it can be seen that Vlow=48, Vhigh=56, INLR(n=1)=16, INLR(n+1=2)=−8, sign{INLR(1)}=1, and sign{INLR(2)}=−1. For main interpolator 6, inp(0,1) are equal to Vhigh=56, and inp(2,3) are equal to Vlow=48. Substituting this information into Equation (2) results in:

$$V_{dacm} = \text{Vlow} + k*(\text{Vhigh} - \text{Vlow})/2^2 = 48 + 2*(56-48)/2^2 = 48 + 16/4 = 52.$$

For calibration and interpolation switch matrix and decoder 21, again it is necessary to swap the input function of calibration and interpolation switch matrix and decoder 21 for the first two gm stages so that inpp(0,1)=0, innn(0,1)=abs(INLR(n+1=2))=8 inpp(2,3)=I NLR(n=1)=16, and innn(2,3)=0. Substituting information from Table 1 into Equation (3) results in:

$$V_{dclb} = -(sign\{INLR(2)\} * k * \text{abs}(INLR(2)) +$$
$$sign\{INLR(1)\} * (2^2 - k) * \text{abs}(INLR(1)))/2^2$$
$$= -(-1 * 2 * 8 + 1 * (2^2 - 2) * 16)/2^2$$
$$= -4.$$

Therefore, according to Equation (1), the DAC output Vout is:

$$\text{Vout} = V_{dacm} + V_{dclb} = 52 + (-4) = 48.$$

b3 b2 b1 b0=0110 n=1, and k=3. From Table 1, it can be seen that Vlow=48, Vhigh=56, INLR(n=1)=16, INLR(n+1=2)=−8, sign{INLR(1)}=1, and sign{INLR(2)}=−1. For main interpolator 6, inp(0–2) are equal to Vhigh=56, and inp(3) is equal to Vlow=48. Substituting this information into Equation (2) results in:

$$V_{dacm} = \text{Vlow} + k*(\text{Vhigh} - \text{Vlow})/2^2 = 48 + 2*(56-48)/2^2 = 48 + 8/4 = 54.$$

For calibration and interpolation switch matrix and decoder 21, again it is necessary to swap the input function of the calibration and interpolation switch matrix and decoder 21 for the first gm three stages so that inpp(0–2)=0, innn(0–2)=abs(INLR(n+1=2))=8, and inpp(3)=INLR(n=1)=16 innn(3)=0. Substituting information from Table 1 into Equation (3) results in:

$$V_{dclb} = -(sign\{INLR(2)\} * k * \text{abs}(INLR(2)) +$$
$$sign\{INLR(1)\} * (2^2 - k) * \text{abs}(INLR(1)))/2^2$$
$$= -(-1*3*8 + 1*(2^2-3)*16)/2^2$$
$$= 2.$$

Therefore, according to Equation (1), the DAC output Vout is:

$$Vout = V_{dacm} + V_{dclb} = 54 + 2 = 56.$$

Next, the MSB portion b3 b2 of DIN changes from 01 to 10, which operates to select R3, so Vlow=56, Vhigh=108, INLR(n=2)=−8, INLR(n+1=3)=12, sign(INLR(2))=−1, and sign(INLR(3))=1.
b3 b2 b1 b0=1000 n=2, and k=0. From Table 1, it can be seen that Vlow=56, Vhigh=108, INLR(n=2)=−8, INLR(n+1=3)=12, sign{INLR (2)}=−1, and sign{INLR(3)}=1. For main interpolator 6, inp(0–3)=Vlow=56. Substituting this information into Equation (2) results in:

$$V_{dacm} = Vlow + k*(Vhigh - Vlow)/2^2 = 56 + 0*(108-56)/2^{2} = 56.$$

For calibration and interpolation switch matrix and decoder 21, inpp(0–3)=0, innn(0–3)=abs(INLR(n=2))=8. Substituting information from Table 1 into Equation (3) results in:

$$V_{dclb} = -(sign\{INLR(3)\} * k * \text{abs}(INLR(3)) +$$
$$sign\{INLR(2)\} * (2^2 - k) * \text{abs}(INLR(2)))/2^2$$
$$= -(1*0*12 + (-1)*(2^2-0)*8)/2^2$$
$$= 8.$$

Therefore, according to Equation (1), the DAC output Vout is:

$$Vout = V_{dacm} + Vd_{clb} = 56 + 8 = 64.$$

b3b2b1b0=1001 n=2, and k=1. From Table 1, it can be seen that Vlow=56, Vhigh=108, INLR(n=2)=−8, INLR(n+1=3)=12, sign{INLR (2)}=−1, and sign{INLR(3)}=1. For main interpolator 6, inp(0)=Vhigh, and inp(1–3)=Vlow=56. Substituting this information into Equation (2) results in:

$$V_{dacm} = Vlow + k*(Vhigh - Vlow)/2^2 = 56 + 1*(108-56)/2^2 = 69.$$

For calibration and interpolation switch matrix and decoder 21, inpp(0)=INLR(n+1=3)=12, innn(0)=0, inpp(1–3)=0, and innn(1–3)=abs(INLR(n=2))=8. Substituting information from Table 1 into Equation (3) results in:

$$V_{dclb} = -(sign\{INLR(3)\} * k * \text{abs}(INLR(3)) +$$
$$sign\{INLR(2)\} * (2^2 - k) * \text{abs}(INLR(2)))/2^2$$
$$= -(1*1*12 + (-1)*(2^2-1)*8)/2^2$$
$$= -(12-24)/4$$
$$= 3.$$

Therefore, according to Equation (1), the DAC output Vout is:

$$Vout = V_{dacm} + Vd_{clb} = 69 + 3 = 72.$$

For DIN equal to 1010 through 1111, the foregoing analysis is repeated for b2b1b0 equal to 010 through 111. Therefore, using the foregoing information and completing the analysis for DN equal to 1010 through 1111 completes the information needed to construct Table 3.

TABLE 3

| DIN | Vlow | Vhigh | delV | INLR | Vdacm | Vdclb | Vout | Vout-ideal | INL |
|---|---|---|---|---|---|---|---|---|---|
| 0000 | 0 | 48 | 48 | 16 | 0 | 0 | 0 | 0 | 0 |
| 0001 | 0 | 48 | 48 | 16 | 12 | −4 | 8 | 8 | 0 |
| 0010 | 0 | 48 | 48 | 16 | 24 | −8 | 16 | 16 | 0 |
| 0011 | 0 | 48 | 48 | 16 | 36 | −12 | 24 | 24 | 0 |
| 0100 | 48 | 56 | 8 | −8 | 48 | −16 | 32 | 32 | 0 |
| 0101 | 48 | 56 | 8 | −8 | 50 | −10 | 40 | 40 | 0 |
| 0110 | 48 | 56 | 8 | −8 | 52 | −4 | 48 | 48 | 0 |
| 0111 | 48 | 56 | 8 | −8 | 54 | 2 | 56 | 56 | 0 |
| 1000 | 56 | 108 | 52 | 12 | 56 | 8 | 64 | 64 | 0 |
| 1001 | 56 | 108 | 52 | 12 | 69 | 3 | 72 | 72 | 0 |
| 1010 | 56 | 108 | 52 | 12 | 82 | −2 | 80 | 80 | 0 |
| 1011 | 56 | 108 | 52 | 12 | 95 | −7 | 88 | 88 | 0 |
| 1100 | 108 | 128 | 20 | −12 | 108 | −12 | 96 | 96 | 0 |
| 1101 | 108 | 128 | 20 | −12 | 113 | −9 | 104 | 104 | 0 |
| 1110 | 108 | 128 | 20 | −12 | 118 | −6 | 112 | 112 | 0 |
| 1111 | 108 | 128 | 20 | −12 | 123 | −3 | 120 | 120 | 0 |

Table 3 shows that, with the above indicated assumptions, the INL of calibrated, interpolating string DAC 20 of FIG. 2 is 0 for each value of DIN, using "ideal" calibration voltages, main interpolator gm stages, and calibration interpolator gm stages. As a practical matter, these assumptions will not be quite true, and there will be small but finite INL errors, but Table 3 nevertheless demonstrates the effectiveness of the INL calibration technique and circuitry of the present invention.

FIGS. 5 and 6 show secondary resistor or "calibration resistor" strings 26 and 27 either of which can be included in calibration voltage generator 26,27 of FIG. 2. Either can be selectively connected in parallel with one or more resistors of the DAC resistor string 25 including resistors R1,2,3 and 4 in response to the MSBs in order to generate the calibration voltage values INLR. Since the calibration coefficients are stored in calibration coefficient memory 36 during the initial measurement step, these coefficients are available to be used for calibration operations during the normal operation of DAC 20. Calibration decoder 35 of FIG. 2 receives the calibration coefficients from calibration coefficients memory 36 in response to the MSBs of DIN. The string DAC tap points of the secondary string 26 of FIG. 5 can be decoded such that the INLR voltage is produced as the difference between Vhclb and Vlclb. In FIG. 5, the calibration voltage values INLR can be generated by connecting calibration string 26 parallel to one or more resistors of main DAC resistor string 25. However, the resulting "loading" or change in effective resistance of main string 25 caused by the parallel connection of the calibration string should be substantially smaller than any resistive errors that might be due to mismatches between the various resistors R1,2,3 and 4 of main DAC resistor string 25.

The circuits of FIGS. 5 and 6 can perform the function of calibration voltage generator 26,27 in FIG. 2. In FIG. 5, an n-bit main resistor string 25 is shown in parallel with an m-bit calibration string 26. As an example, calibration string 26 is connected to resistor R1 in order to obtain the calibration voltage values of INLR for all the tap point errors. Calibration string 26 also can be connected in parallel with any other resistor, for example, resistor R2, in order to obtain the calibration voltage values of INLR for the tap point connected to the upper terminal of resistor R2. Also, the calibration string 26 could be connected across more than one of the string resistors of main string 25.

In FIG. 6, the calibration string 27 is implemented somewhat differently. Instead of all of the resistors in the calibration string having a value Rclb, calibration string 27 includes a first sub-string 27A including series-connected resistors each having a resistance of $2^k$Rclb and a second sub-string 27B including series-connected resistors each having a resistance of Rclb. The reason for this configuration is that it requires less control logic and less integrated circuit chip area.

The above calibrated interpolating string DAC 20 shown in FIG. 2 has been simplified to include only a 2-bit coarse string DAC followed by a 2-bit main interpolator, but the illustrated structure can be easily expanded to include and 8-bit coarse string DAC followed by an 8-bit main interpolator and an 8-bit calibration interpolator according to the present invention.

The above idea can be further generalized for M-bit string DAC followed by an N-bit interpolator DAC. A system simulation has been performed for and 8-bit coarse string back and an 8-bit interpolator DAC. The above described interpolators are shown only for identical gm stages. However, the idea is applicable for binary weighted gm stages or combinations of the two different types of gm stages. Furthermore, there can be a ratio between the main interpolator and calibration interpolator wherein the calibration interpolator is a fraction of or a multiple of the main interpolator.

The calibration correction circuit can also be used to correct the offset of the DAC. The offset of the DAC is measured and all the tap errors for the calibration circuit are shifted by the amount of the measured offset. The calibration correction circuit and then not only corrects the INL error but also corrects the offset error of the DAC.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. An M+N bit DAC comprising:

an N-bit main interpolation circuit for interpolating, in response to an N-bit portion of an M+N bit input word, between a first and second voltages that have been produced on first and second conductors, respectively, in response to an M-bit portion of the M+N bit input word;

a calibration interpolation circuit;

a memory circuit for storing digital error correction information corresponding to various values of the first voltage and the second voltage;

conversion circuitry responsive to the M-bit portion of the M+N bit input word to convert digital error correction information from the memory to analog correction signals applied to inputs of the calibration interpolation circuit; and outputs of the N-bit interpolation circuit and the calibration interpolation circuit being coupled to inputs of an output amplifier so as to correct integral nonlinearity errors associated with the first and second voltages.

2. An interpolation circuit for interpolating between a first voltage on a first conductor and a second voltage on a second conductor comprising:

(a) a plurality of differential voltage-to-current converter circuits each including a first transistor and a second transistor each having a source coupled to a corresponding current source;

(b) an output amplifier having first and second inputs coupled to drains of various first and second transistors, respectively, the output amplifier producing an output voltage coupled to a gate of each of the second transistors;

(c) a first switch circuit configured to selectively couple gates of various first transistors to one of the first conductor and the second conductor in response to a plurality of digital bit signals, respectively; and (d) a calibration interpolation circuit including i. a plurality of differential voltage-to-current converter circuits each including a first transistor and a second transistor each having a source coupled to a corresponding current source, ii. a memory circuit coupled to a third conductor and a fourth conductor for storing digital error correction coefficients corresponding to various values of the first voltage and second voltage and accessible to provide analog error correction signals on the third and fourth conductors, iii. a conversion circuit for accessing the memory circuit to obtain a digital error correction coefficient and converting the digital error correction coefficient to a corresponding analog error correction signal and producing the analog error correction signal on one of the third and fourth conductors, iv. a second switch circuit configured to selectively couple gates of various first transistors of the plurality of differential voltage-to-current converter circuits of the calibration interpolation circuit to one of the third conductor and the fourth conductor in response to the plurality of digital bit signals, respectively, and v. a drain of each of the first transistors of the calibration interpolation circuit being coupled to the first input of the output amplifier and a drain of each of the second transistors of the calibration interpolation circuit being coupled to the second input of the output amplifier so as to cause the output amplifier to produce a value of the output voltage that is corrected for the errors in the various values of the first and second voltages.

3. The interpolation circuit of claim 2 wherein a load circuit includes a first load device coupled by a fifth conductor to drains of the first transistors of the differential-to-current converter circuits, the first load device also being coupled to an inverting input of the output amplifier, and a second load device coupled by a sixth conductor to drains of the second transistors of the voltage-to-current converter circuits and a non-inverting input of the output amplifier.

4. The interpolation circuit of claim 3 wherein the first and second load devices are N-channel MOSFETs, and wherein a gate of the first load device is connected to a gate and drain of the second load device, and wherein the first and second load devices constitute a current mirror.

5. The interpolation circuit of claim 4 wherein the first and second transistors of the differential voltage-to-current converter circuits are P-channel MOSFETs.

6. An M+N bit digital-to-analog converter (DAC) for converting an M+N bit input word including an M-bit MSB subword and an N-bit LSB subword to an analog output signal, comprising:
  (a) a string DAC section including
    i. a plurality of series-connected string resistors, and
    ii. an MSB subword decoding and switching circuit configured to selectively couple voltages on first and second terminals of selected string resistors to first and second conductors in response to the MSB subword, respectively, first and second terminals of the various string resistors being coupled to various tap points of the plurality of series-connected string resistors;
  (b) an interpolation DAC section including
    i. a plurality of differential circuits each including a current source and a first transistor and a second transistor each having a source coupled to the current source,
    ii. a first LSB subword decoding and switching circuit configured to selectively couple gates of various first transistors of the interpolation DAC section to one of the first and second conductors in response to the LSB subword, respectively, and
    iii. an output amplifier having first and second inputs coupled to drains of various first transistors and second transistors of the interpolation DAC section and to a load circuit and producing an output voltage coupled to a gate of each of the second transistors; and
  (c) a calibration interpolation circuit including
    i. a plurality of differential circuits each including a current source and a first transistor and a second transistor each having a source coupled to a corresponding current source,
    ii. a memory circuit coupled to a third conductor and a fourth conductor for storing digital error correction coefficients corresponding to various values of the first voltage and second voltage and accessible to provide analog error correction signals on the third and fourth conductors,
    iii. a conversion circuit for accessing the memory circuit to obtain a digital error correction coefficient and converting the digital error coefficient to a corresponding analog error correction signal and producing the analog error correction signal on one of the third and fourth conductors,
    iv. a second switch circuit configured to selectively couple gates of various first transistors of the plurality of differential converter circuits of the calibration interpolation circuit to one of the third conductor and the fourth conductor in response to the plurality of digital bit signals, respectively,
    v. a drain of each of the first transistors of the calibration interpolation circuit being coupled to the first input of the output amplifier and a drain of each of the second transistors of the calibration interpolation circuit being coupled to the second input of the output amplifier so as to cause the output amplifier to produce a value of the output voltage that is corrected for the errors in the various values of the first and second voltages, and
    vi. a second LSB subword decoding and switching circuit configured to selectively couple gates of various first transistors of the plurality of differential circuits of the calibration interpolation circuit to one of the third conductor and the fourth conductor in response to the LSB subword.

7. The M+N bit digital-to-analog converter of claim 6 wherein a drain of each of the first transistors of the calibration interpolation circuit is coupled to the first input of the output amplifier and a drain of each of the second transistors of the calibration interpolation circuit being coupled to the second input of the output amplifier so as to cause the output amplifier to produce a value of the output voltage that is corrected for the integral nonlinearity of the M+N bit digital-to-analog converter.

8. The M+N bit digital-to-analog converter of claim 6 including a circuit for converting digital error calibration coefficients from the memory circuit to corresponding analog error correction signals in response to the plurality of digital bit signals.

9. The M+N bit digital-to-analog converter of claim 6 including a circuit coupled to the various tap points and the memory circuit for generating ideal tap point voltages corresponding to at least some of the various tap points and determining digital error correction coefficients for each such tap point equal to the difference between an actual tap point voltage and an ideal tap point voltage for that tap point and storing the digital error correction coefficients in the memory circuit.

10. The M+N bit digital-to-analog converter of claim 9 including a circuit wherein the circuit for determining the digital error correction coefficients includes circuitry converting the M-bit MSB subword to actual analog signals representing actual tap point voltages, a circuit for converting the actual analog signals to actual digital representations, comparing the actual digital representations to corresponding ideal digital representations to determine the digital error correction coefficients, and writing the digital error correction coefficients into corresponding locations of the memory circuit in response to the M-bit MSB subword.

11. The M+N bit digital-to-analog converter of claim 6 wherein the memory circuit is a nonvolatile memory circuit.

12. The M+N bit digital-to-analog converter of claim 6 wherein the memory circuit is accessed at memory addresses determined in response to the M-bit MSB subword both to initially write the digital error correction coefficients into the memory circuit and later to access the memory circuit to obtain the digital error correction coefficients from the memory circuit and convert the accessed digital error correction coefficients to analog values provided on the third and fourth and conductors during normal operation of the M+N bit digital-to-analog converter.

13. The M+N bit digital-to-analog converter of claim 6 wherein the resistances of the string resistors are substantially equal, the current sources are equal, and the sizes of the first transistors and the second transistors are equal.

14. The M+N bit digital-to-analog converter of claim 6 wherein the differential circuits are differential voltage-to-current converter circuits.

15. The M+N bit digital-to-analog converter of claim 14 wherein the first transistors and second transistors of the plurality of differential circuits of the interpolation DAC section are P-channel MOSFETs and wherein the first transistors and second transistors of the plurality of differential voltage-to-current converter circuits of the calibration interpolation circuit are P-channel MOSFETs.

16. The M+N bit digital-to-analog converter of claim 15 wherein the first and second transistors of the differential voltage-to-current converter circuits are P-channel MOSFETs.

17. The M+N bit digital-to-analog converter of claim 14 wherein a load circuit includes a first load device coupled by a fifth conductor to drains of the first transistors of the differential-to-current converter circuits, the first load device also being coupled to an inverting input of the output amplifier, and a second load device coupled by a sixth conductor to drains of the second transistors of the voltage-to-current converter circuits and a non-inverting input of the output amplifier.

18. The M+N bit digital-to-analog converter of claim 17 wherein the first and second load devices are N-channel MOSFETs, and wherein a gate of the first load device is connected to a gate and drain of the second load device, and wherein the first and second load devices constitute a current mirror.

19. The M+N bit digital-to-analog converter of claim 6 including a calibration voltage generator including a string of calibration resistors coupled in series across at least one of the string resistors of the string DAC section.

20. The M+N bit digital-to-analog converter of claim 6 wherein the first and second load devices are MOSFETs, and wherein a gate of the first load device is connected to a gate and drain of the second load device, and wherein the first and second load devices constitute a current mirror.

21. An M+N bit digital-to-analog converter (DAC) for converting an M+N bit input word including an M-bit MSB subword and an N-bit LSB subword to an analog output signal, comprising:
(a) a string DAC section including
 i. a plurality of series-connected string resistors, and
 ii. first switching means for selectively coupling voltages on first and second terminals of selected string resistors to first and second conductors in response to the MSB subword, respectively, first and second terminals of the various string resistors being coupled to various tap points of the plurality of series-connected string resistors;
(b) an interpolation DAC section including
 i. a plurality of differential circuits each including a current source and a first transistor and a second transistor each having a source coupled to the current source,
 ii. second switching means for selectively coupling gates of various first transistors of the interpolation DAC section to one of the first and second conductors in response to the LSB subword, respectively, and
 iii. amplifier means having first and second inputs coupled to drains of various first transistors and second transistors of the interpolation DAC section and to a load circuit for producing an output voltage coupled to a gate of each of the second transistors; and
(c) a calibration interpolation circuit including
 i. a plurality of differential circuits each including a current source and a first transistor and a second transistor each having a source coupled to the current source,
 ii. means coupled to third and fourth conductors for storing digital calibration coefficients for the various tap points, and accessible in response to the MSB subword,
 iii. means for producing analog error correction signals on the third and fourth conductors in response to the accessed digital correction coefficients, and,
 iv. second switching means for selectively coupling gates of various first transistors of the plurality of differential circuits of the calibration interpolation circuit to one of the third conductor and the fourth conductor in response to the LSB subword.

22. A method of converting an M+N bit input word to an analog value, the method comprising:
operating an N-bit interpolation circuit in response to an N-bit portion of an M+N bit input word to interpolate between first and second voltages that have been produced on first and second conductors, respectively, in response to an M-bit portion of the M+N bit input word;
storing digital error correction information corresponding to various values of the first voltage and the second voltage in a memory circuit;
converting digital error correction information from the memory circuit to analog correction signals in response to the M-bit portion of the M+N input word and applying the analog correction signals to inputs of a calibration interpolation circuit; and
coupling output signals produced by the N-bit interpolation circuit and the calibration interpolation circuit to inputs of the output amplifier so as to correct integral nonlinearity errors associated with the first and second voltages.

23. A method of calibrating an M+N bit digital-to-analog converter (DAC) for converting an M+N bit input word including an M-bit MSB subword and an N-bit LSB subword to an analog output voltage,
the M+N bit DAC including a string DAC section including a plurality of series-connected string resistors, and an MSB subword decoding and switching circuit for selectively coupling voltages on first and second terminals of selected string resistors to first and second conductors in response to the MSB subword, respectively, first and second terminals of the various string resistors being coupled to various tap points of the plurality of series-connected string resistors,
the method including:
(a) providing a first group of differential stages each including a first input transistor and a second input transistor and a current source coupled to both a source electrode of the first input transistor and a source electrode of the second input transistor, a gate electrode of each second input transistor being coupled to an output of an amplifier;
(b) coupling gate electrodes of various first input transistors to the first conductor according to the LSB subword, and coupling a gate electrode of one of the first input transistors to the second conductor;

(c) conducting drain currents of at least some of the first input transistors into a first summing conductor, and conducting drain currents of at least some of the second input transistors into a second summing conductor;

(d) storing digital error correction coefficients for various tap points of the string DAC section in a memory in locations thereof determined in response to the MSB subword;

(e) providing a second group of differential stages each including a first input transistor and a second input transistor and a current source coupled to both a source electrode of the first input transistor and a source electrode of the second input transistor;

(f) accessing a digital error correction coefficient in the memory in response to an MSB subword, converting the accessed digital error correction coefficient to an analog error correction signal, and applying the analog error correction signal to one of a third conductor and a fourth conductor;

(g) coupling gate electrodes of various first input transistors of the second group to one of the third conductor and the fourth conductor according to the LSB subword, and coupling gate electrodes of various second input transistors of the second group to the other of the third and fourth conductors;

(h) conducting drain currents of at least some of the first input transistors of the second group into the first summing conductor and conducting drain currents of at least some of the second input transistors of the second group into the second summing conductor; and (i) operating the amplifier to produce the analog output voltage in response to the currents in the first and second summing conductors so as to calibrate the analog output voltage to compensate for integral nonlinearity of the string DAC section.

* * * * *